United States Patent
Kirmuss et al.

(10) Patent No.: US 11,690,166 B1
(45) Date of Patent: Jun. 27, 2023

(54) PCB BOARD FOR MULTI-SYSTEM INTERCONNECT

(71) Applicant: Dark Wolf Ventures LLC, Berthoud, CO (US)

(72) Inventors: Phil Kirmuss, Berthoud, CO (US); Glenn Williams, Peachtree Corners, GA (US); Brian E. Wilkerson, Louisville, CO (US)

(73) Assignee: Dark Wolf Ventures LLC, Berthoud, CO (US)

( * ) Notice: Subject to any disclaimer, the term of this patent is extended or adjusted under 35 U.S.C. 154(b) by 0 days.

(21) Appl. No.: 17/374,379

(22) Filed: Jul. 13, 2021

Related U.S. Application Data

(60) Provisional application No. 63/051,152, filed on Jul. 13, 2020.

(51) Int. Cl.
*H05K 1/02* (2006.01)
*H05K 1/18* (2006.01)

(52) U.S. Cl.
CPC .......... *H05K 1/0237* (2013.01); *H05K 1/181* (2013.01); *H05K 2201/09218* (2013.01)

(58) Field of Classification Search
CPC ......... H05K 1/18; H05K 1/181; H05K 1/0237
See application file for complete search history.

(56) References Cited

U.S. PATENT DOCUMENTS

| | | | | |
|---|---|---|---|---|
| 2002/0181214 A1* | 12/2002 | Levy | ...................... | H05K 1/141 361/760 |
| 2003/0052176 A1* | 3/2003 | Nozawa | ............... | H05K 1/0274 235/492 |
| 2005/0035436 A1* | 2/2005 | Novak | .................... | H01L 23/50 257/E23.079 |
| 2006/0003755 A1* | 1/2006 | Kuo | ......................... | H04B 1/38 455/418 |

* cited by examiner

*Primary Examiner* — Jeremy C Norris
(74) *Attorney, Agent, or Firm* — Suiter Swantz pc llo

(57) ABSTRACT

Broadly, embodiments of the inventive concepts disclosed herein are directed to a PCB data board that allows for either a single configuration or to be deployed in conjunction with another configuration such as being able to control a radio and sending PLI (Positional Location Information) data. The PCB data board and associated code can accommodate multiple different configurations. The PCB data board may facilitate multiple radio connectivity, enhanced configuration utilities, and additional functions.

20 Claims, 1 Drawing Sheet

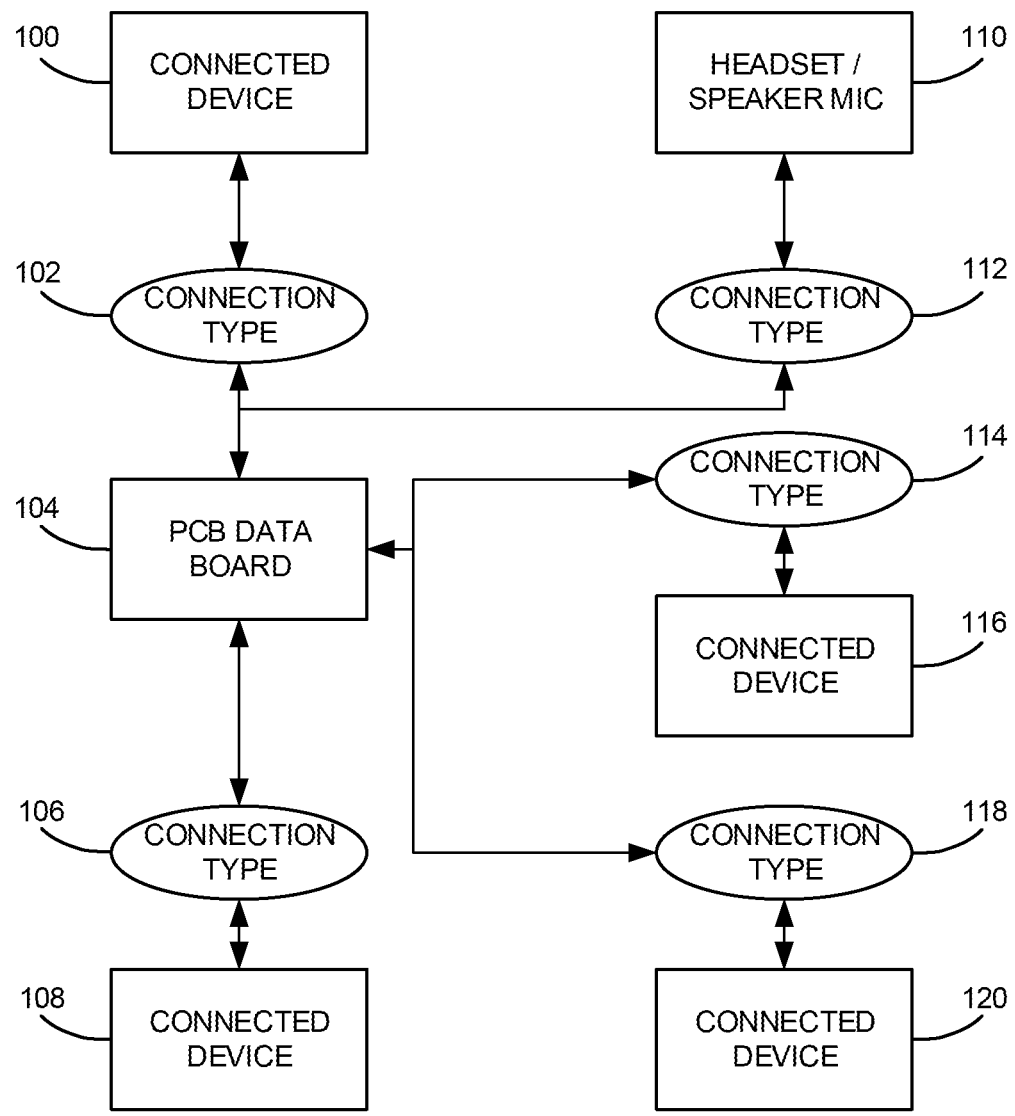

PCB BOARD FOR MULTI-SYSTEM INTERCONNECT

PRIORITY

The present application claims the benefit under 35 U.S.C. § 119(e) of U.S. Provisional App. No. 63/051,152 (filed Jul. 13, 2020), which is incorporated herein by reference.

BACKGROUND

Existing PCB radio interconnection devices are designed for specific hardware interconnections and audio/data routing. It would be advantageous to have a compact PCB device capable of dynamic routing and power regulation between differently connected devices.

SUMMARY

In one aspect, embodiments of the inventive concepts disclosed herein are directed to a PCB data board that allows for either a single configuration or to be deployed in conjunction with another configuration such as being able to control a radio and sending PLI (Positional Location Information) data. The PCB data board and associated code can accommodate multiple different configurations.

In a further aspect, the PCB data board may facilitate multiple radio connectivity, enhanced configuration utilities, and additional functions.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying FIGURES in which:

FIG. 1 shows a block diagram according to an exemplary embodiment;

DETAILED DESCRIPTION

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a PCB data board that allows for either a single configuration or to be deployed in conjunction with another configuration such as being able to control a radio and sending PLI (Positional Location Information) data. The PCB data board and associated code can accommodate multiple different configurations. The PCB data board may facilitate multiple radio connectivity, enhanced configuration utilities, and additional functions.

Referring to FIG. 1, a block diagram of an exemplary embodiment is shown. A PCB board 104 is connected to a plurality of connected devices 100, 108, 116, 120, each connected to the PCB board 104 via a connection type 102, 106, 114, 118. Furthermore, the PCB board 104 may be connected to a headset/speaker mic 110 via a connection type 112. Each connected device 100, 108, 116, 120 may comprise a radio, laptop or PC, smart phone or tablet, an embedded device, etc. Connection types 102, 106, 114, 118 may include audio, serial, USB, TCP/IP, power in or out, Bluetooth, WiFi, etc.; furthermore, the headset/speaker mic connection type 112 may include an audio connection and/or power out to a mic.

In at least one embodiment, the PCB board 104 is configured to handle interconnects between the connected devices 100, 108, 116, 120 and headset/speaker mic 110. The PCB board 104 includes a processor that may be configured via processor executable code stored in a data storage element to handle and route data and audio between the connected devices connected devices 100, 108, 116, 120 and headset/speaker mic 110. Configurations may enable the use of a data and audio handling device placed between a radio, phone, non-conformal battery, and headset. Changes to functionality are primarily accomplished through processor executable code changes, rather than physical hardware adjustments.

Embodiments of the PCB board 104 may include a power regulator to distribute power in and out of the PCB board 104. In some embodiments, the power regulator may have a 4.5-17 VDC operating range. In at least one embodiment, the PCB board 104 may be approximately the size of a AAA battery and configured to be placed in over-molded PTT mounting holes for a physical PTT switch.

The processor is configured to collect data and audio for distribution to a smart phone or PC via corresponding connection types 102, 106, 114, 118. In at least one embodiment, the PCB board 104 is configured to accommodate an Electret or dynamic mic, or external amplifiers. In at least one embodiment, the processor is configured to implement one or more audio codecs as defined by the connected devices 100, 108, 116, 120. Data and audio may be buffered and stored on the processor; alternatively, or in addition, the PCB board 104 may include an onboard SPI and/or Micro SD card connected to the processor for greater storage capability.

The PCB board 104 may be configured via the processor executable code as a local audio and data bridge, a remote audio and data bridge, a data backhaul device, a mapping software tool, a keypad display unit (KDU) emulator, a GPS/data logger, or a voice recorder/remote listening device.

In at least one embodiment, where the PCB board 104 is configured as a local audio and data bridge, the PCB board processor is configured to allows two or more radios, each in data communication with the processor via a connection type 102, 106, 114, 118, to be connected in a configuration where the processor merges multiple channels or talk groups into one common patch talk path. The PCB board 104 controls the audio being sent to and from the radios via COR and/or VOX. In at least one embodiment, data such as GPS or SDM may be forwarded as well if the connected radio has a functional data port accessible via the connection type 102, 106, 114, 118. The processor is configured to identify a cable type such as a smart cable and automatically establish appropriate data processing paths according to a set of stored configurations.

In one exemplary embodiment, when a natural disaster happens and two responding agencies need to communicate and share PLI data, it is often the case that the agencies utilize incompatible systems such as a VHF P25 system and the other a 7/800 NXDN system. The PCB board 104 allows both users to communicate by patching the audio paths without having to reprogram radios. Additionally, SDM's or PLI may be sent back and forth between platforms. If each radio's data interface supports unit ID's being sent then this can also be maintained between systems.

A PCB board 104 according to an exemplary embodiment may replace bulky fixed gateways that require large spaces and physical adjustments.

In at least one embodiment, where the PCB board 104 is configured as a remote audio and data bridge, the PCB board processor is configured similarly to the local audio and data bridge embodiment, while additionally configured to push both the audio and data from the connected radios out over any IP connected to another data board, including a similarly configured PCB board 104, expanding the network and AOR.

In one exemplary embodiment, a unit deploys and is operating with coalition forces; a commander in another part of the world can view and talk to the unit operating with coalition forces.

In at least one embodiment, here the PCB board 104 is configured as a data backhaul device, the PCB board processor is configured as a data handler between connected radio or radios to manage the flow of data from these devices and either a peripheral device or an application such as ATAK. Such embodiments enable remote sensor control.

In one exemplary embodiment, an end user may wish to utilize existing P25 or IDAS network to backhaul remote sensor data ranging from a scientist's weather station to a border patrol seismic sensor. The PCB board 104 receives and translates data according to a defined translation algorithm so that the connected radio can send it out and, once received on the other end of the RF path, another data board may translate the data back and present into the viewing platform such as ATAK, Arc Map, etc.

In at least one embodiment, where the PCB board 104 is configured as a mapping software tool, the PCB board 104 enables GPS mapping functionality via two-way radios on a digital or trunked system. Map data can be displayed in a number of mapping applications, including display on another radio, tablet, or computer.

In one exemplary embodiment, a public safety agency may display GPS information for a vehicle or person on a trunking system. The PCB board 104 operates as a network interface device and receives GPS data off the network infrastructure and bring it back out into a format that the mapping application recognizes.

In at least one embodiment, where the PCB board 104 is configured as a KDU emulator, the PCB board 104 emulates any radio control command, where any radio may be virtualized in software on a smart phone or PC and be able to remotely interact and control it.

In one exemplary embodiment, where a receiver or non-accessible radio needs to have the channel changed for an operation, it could be achieved remotely. Conversely if a radio is concealed with a data board connected out of sight, an undercover unit can talk back via Bluetooth or Wi-Fi to the PCB board 104 and talk back out over the encrypted network.

In at least one embodiment, where the PCB board 104 is configured as a GPS data logger, the PCB board 104 stores GPS data, power levels, units IDs, etc. Any data being generated and emitted from a radio may be recorded, adding the logging capability for legacy radios.

In one exemplary embodiment, command staff, dispatch centers, or radio technicians can monitor the status of radios in the field and determine how to address issues. For example, extended incidents such as active shooters often cause issues with radios needing recharged/battery swaps or require monitoring of the status of unit IDs for relief, tracking resources, or other applications.

In at least one embodiment, where the PCB board 104 is configured as a voice recorder/remote listening device, the PCB board 104 stores audio locally for future play back, and if connected to another radio or smart phone/PC, allows for remote access via software application to either download or listen to the audio and stream the audio feed live.

In some exemplary embodiments, a remote interpreter can translate the audio live from a remote receiver giving live updates of communication being monitored; during a wildland fire, a communication manager for a federal incident or radio dispatcher can turn any radio into a recorder for monitoring the events that occurred for legal purposes or clarification; for after action reporting, audio may be played back from an exercise or operation as a training tool; or by providing and capturing raw RF data (IQ data) the PCB board 104 may provide the IQ data for post signal processing and analysis.

Embodiments of the PCB enable a number of highly desirable functions for law enforcement, first responders, and military users. This is just a sample of capabilities.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. A PCB board comprising:
   a plurality of device connection points; and
   at least one processor in data communication with a memory storing processor executable code for configuring the at least one processor to:
   establish a connection to each of a plurality of connected devices, each of the plurality of connected devices connected to one of the device connection points;
   identify a connected device type associated with each of the plurality of connected devices;
   configure a connection type for each connected device based on the identified connected device type;
   configure the PCB board as an audio and data bridge;
   identify a plurality of talk groups, each defined by a connected device; and
   merge the plurality of talk groups into a common patch talk path.

2. The PCB board of claim 1, further comprising a power regulator connected to the at least one process and each of the plurality of device connection points.

3. The PCB board of claim 2, wherein the power regulator is configured to operate within a range of 4.5 and 17 VDC.

4. The PCB board of claim 1, wherein the at least one processor configures the PCB board as a local audio and data bridge.

5. The PCB board of claim 1, wherein the at least one processor configures the PCB board as a remote audio and data bridge.

6. The PCB board of claim 1, wherein the at least one processor configures the PCB board as a data backhaul device.

7. The PCB board of claim 1, wherein the at least one processor configures the PCB board as a KDU emulator.

8. The PCB board of claim 1, wherein the at least one processor configures the PCB board as a GPS/data logger.

9. A system comprising:
   a PCB board comprising:
   a plurality of device connection points; and
   at least one processor in data communication with a memory storing processor executable code for configuring the at least one processor to:
   establish a connection to each of a plurality of connected devices, each of the plurality of connected devices connected to one of the device connection points;
   identify a connected device type associated with each of the plurality of connected devices;
   configure a connection type for each connected device based on the identified connected device type;
   configure the PCB board as an audio and data bridge;
   identify a plurality of talk groups, each defined by a connected device; and
   merge the plurality of talk groups into a common patch talk path.

10. The System of claim 9, further comprising a power regulator connected to the at least one process and each of the plurality of device connection points.

11. The System of claim 10, wherein the power regulator is configured to operate within a range of 4.5 and 17 VDC.

12. The System of claim 9, wherein the at least one processor configures the PCB board as a local audio and data bridge.

13. The System of claim 9, wherein the at least one processor configures the PCB board as a remote audio and data bridge.

14. The System of claim 9, wherein the at least one processor configures the PCB board as a data backhaul device.

15. The System of claim 9, wherein the at least one processor configures the PCB board as a KDU emulator.

16. The System of claim 9, wherein the at least one processor configures the PCB board as a GPS/data logger.

17. A system comprising:
   a PCB board comprising:
   a plurality of device connection points; and
   at least one processor in data communication with a memory storing processor executable code for configuring the at least one processor to:
   establish a connection to each of a plurality of connected devices, each of the plurality of connected devices connected to one of the device connection points;
   identify a connected device type associated with each of the plurality of connected devices;
   configure a connection type for each connected device based on the identified connected device type;
   dynamically configure the PCB board as one of a local audio and data bridge, a remote audio and data bridge, a data backhaul device, a KDU emulator, and a GPS/data logger;
   establish an IP connection to a remote PCB board; and
   merge a plurality of audio channels into a common patch talk path over the IP connection.

18. The System of claim 17, wherein the at least one processor is further configured to remotely activate a recording feature on each of the plurality of connected devices.

19. The System of claim 17, further comprising a power regulator connected to the at least one process and each of the plurality of device connection points.

20. The System of claim 19, wherein the power regulator is configured to operate within a range of 4.5 and 17 VDC.

* * * * *